United States Patent [19]
Queen et al.

[11] Patent Number: 5,497,078
[45] Date of Patent: Mar. 5, 1996

[54] METHOD AND SYSTEM FOR DRIVING AN AIR CORE GAUGE WITH IMPROVED POINTER RESOLUTION

[75] Inventors: Joseph R. Queen, Royal Oak; Terry T. Cwik, Salem; Charles G. Hellebuyck, Dearborn, all of Mich.

[73] Assignee: Ford Motor Company, Dearborn, Mich.

[21] Appl. No.: 363,810

[22] Filed: Dec. 27, 1994

[51] Int. Cl.⁶ .............................. G01R 5/16; G01R 23/00
[52] U.S. Cl. ......................... 324/146; 324/143; 324/167; 364/484
[58] Field of Search ................................ 324/143, 144, 324/146, 147, 166, 167, 154 R; 364/484, 424.01, 556, 509, 550; 340/870.19; 73/313, 308

[56] References Cited

U.S. PATENT DOCUMENTS

| | | | |
|---|---|---|---|
| 4,230,984 | 10/1980 | Taylor | 324/167 X |
| 4,782,699 | 11/1988 | Gonze | 324/144 |
| 4,841,238 | 6/1989 | Birch | 73/308 |
| 4,924,178 | 5/1990 | Miyajima | 324/143 X |
| 4,991,098 | 2/1991 | Dantzler | 324/146 X |
| 5,004,976 | 4/1991 | Markow et al. | 324/144 X |
| 5,050,433 | 9/1991 | Lumetta | 73/313 |
| 5,051,688 | 9/1991 | Murase et al. | 324/143 |
| 5,309,087 | 5/1994 | Markow et al. | 324/146 |
| 5,347,213 | 9/1994 | Johnston et al. | 324/143 |

*Primary Examiner*—Sandra L. O'Shea
*Assistant Examiner*—J. M. Patidar
*Attorney, Agent, or Firm*—P. K. Godwin; R. L. May

[57] ABSTRACT

A method and system for driving an air core gauge whereby pointer resolution of an air core gauge is improved across a full range of motion. The method including the steps of generating a first gauge control signal responsive to a signal, the first gauge control signal having a first duty cycle corresponding to a first pointer position; generating a second gauge control signal responsive to the signal, the second gauge control signal having a second duty cycle corresponding to a second pointer position; and modulating between the first gauge control signal and the second gauge control signal alternating drive periods to drive the gauge pointer to display an average pointer position.

17 Claims, 2 Drawing Sheets

METHOD AND SYSTEM FOR DRIVING AN AIR CORE GAUGE WITH IMPROVED POINTER RESOLUTION

BACKGROUND OF THE INVENTION

The invention relates generally to air core gauges and more particularly to a method and system for driving such gauges.

Air core gauges are typically driven in response to predetermined current levels applied to two or more coils. These coil currents create a magnetic field which causes a gauge pointer magnetically coupled to the coils by a magnetic rotor to align itself with the resultant magnetic field vector. Positioning of the pointer is controlled by varying the direction and magnitude of the current in the coils.

Several methods of driving the coils have been heretofore known. For example, it is known to drive cross-coil type gauges by varying the magnitude and direction of the currents in the coils. It has similarly been known to use pulse width modulation (PWM) to drive both cross-coil and wye-winding type air core gauges. The magnitude and direction of the currents through the coils in such systems are controlled by varying the duty cycle of the PWM signals.

Theoretically, gauge drive strategies employing PWM should be able to provide any degree of pointer resolution desired for a given application. In practice, however, gauge resolution is limited by competing hardware and software constraints which often must be compromised for optimum system performance. For example, a faster software loop allows for the gauge pointer position to be updated more frequently which results in better pointer resolution. However, the software interrupt time required to obtain the desired resolution may not permit enough time for all of the operations necessary to update the pointer position to be performed.

The limitations in pointer resolution caused by system hardware and software design constraints are particularly noticeable in the upper end of a nonlinear gauge's range of motion. For example, if a given PWM drive strategy is constrained to a duty cycle step of 200 microseconds and a drive period of 12.5 milliseconds, the drive resolution (duty cycle step/drive period) will be limited to 1.6% across the full range of motion. In some nonlinear gauges, this 1.6% resolution results in 3 degrees of pointer motion between duty cycle steps at the lower end of the range of pointer motion. However, the same 1.6% resolution will result in 6 degrees of pointer motion between duty cycle steps at the upper end of the range of pointer motion. Therefore, if 6 degrees of pointer movement is beyond the acceptable limit for the given application, the system will not be able to provide the desired pointer resolution.

A need therefore exists for a method and system for driving an air core gauge to provide improved pointer resolution given system design constraints.

SUMMARY OF THE INVENTION

An object of the present invention is to improve pointer resolution of an air core gauge across a full range of motion. The above object is achieved, and disadvantages of prior approaches overcome, by the present invention which provides both a method and system for driving an air core gauge. In one particular embodiment, the method includes the steps of: generating a first gauge control signal responsive to a signal, the first gauge control signal having a first duty cycle corresponding to a first pointer position; generating a second gauge control signal responsive to the signal, the second gauge control signal having a second duty cycle corresponding to a second pointer position; and modulating between the first gauge control signal and the second gauge control signal alternating drive periods to drive the gauge pointer to display an average pointer position.

Such a method can be used to advantage, for example, in a fuel measurement system that displays fuel level in a vehicle fuel tank. The system preferably includes a fuel level sensor coupled to the vehicle fuel tank for generating a fuel level signal; processing means responsive to the fuel level signal for deriving a desired pointer position; a control signal generator responsive to the processing means for generating a first fuel gauge control signal having a first duty cycle corresponding to a first pointer position and a second fuel gauge control signal having a second duty cycle corresponding to a second pointer position; a modulator for modulating an output of the control signal generator between the first fuel gauge control signal and the second fuel gauge control signal to provide a modulated gauge control signal to drive the pointer to the desired pointer position; and a gauge having a pointer responsive to the modulated gauge control signal for displaying the fuel level.

An advantage of the above aspect of the invention is that pointer resolution is improved across a full range of motion.

BRIEF DESCRIPTION OF THE DRAWINGS

The objects and advantages described herein will be more fully understood by reading the description of the preferred embodiment with particular reference to the drawings wherein.

DETAILED DESCRIPTION OF THE PREFERRED EMBODIMENT

Figure 1:
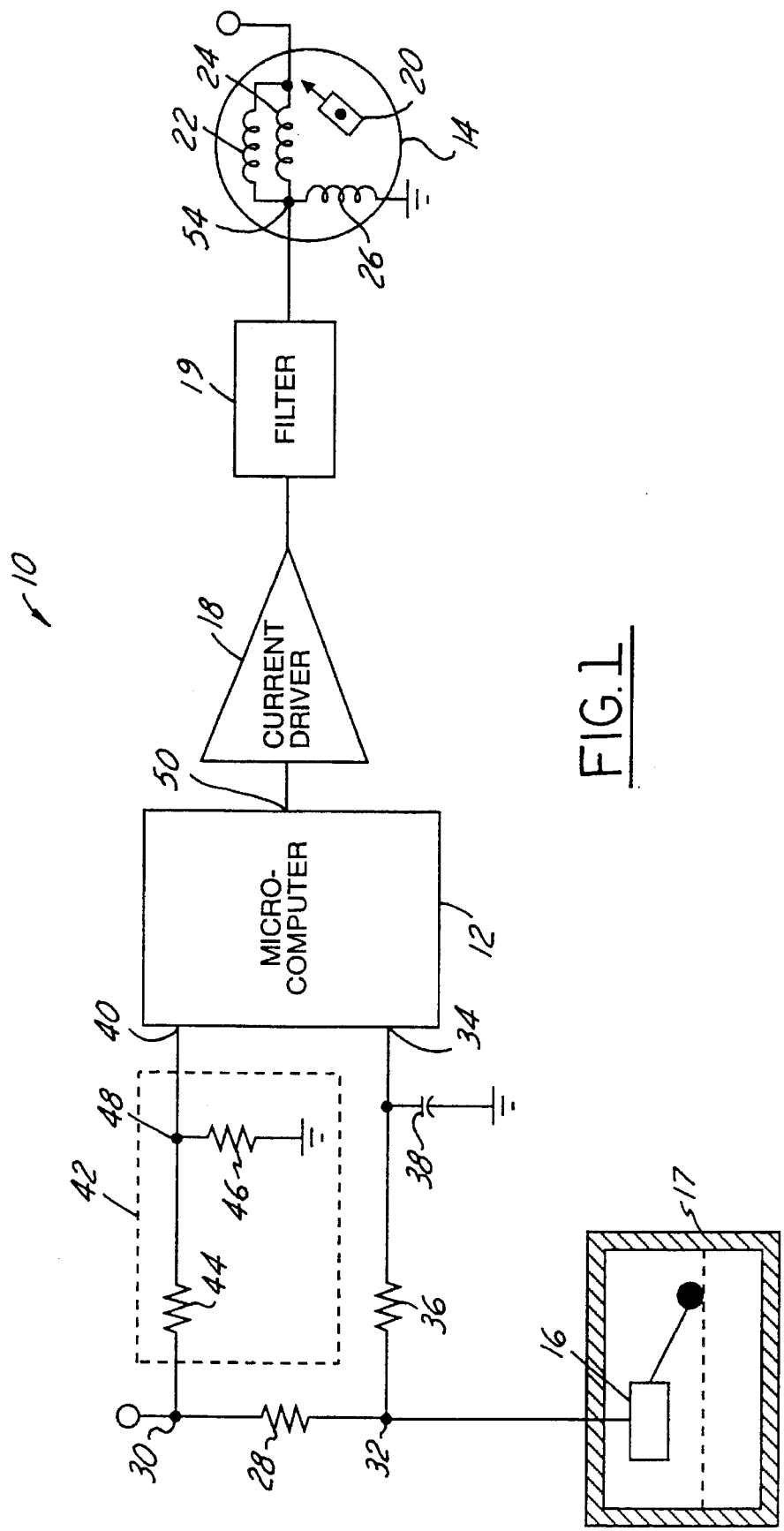
FIG. 1 is a block diagram of a fuel measurement system in which the invention is used to advantage.

An example of an embodiment in which the invention claimed herein is used to advantage is now described with reference to the attached figures. Referring first to FIG. 1, vehicle fuel level measurement system 10 is shown wherein microcomputer 12 controls fuel gauge 14 in response to signals from float operated variable resistance fuel level sensor 16 which is coupled to vehicle fuel tank 17. Conventional current driver 18 and signal conditioning filter 19 are included to amplify and filter the output drive signal from microcomputer 12.

Fuel gauge 14, as shown, is a conventional nonlinear air core gauge with pointer 20 magnetically coupled to coils 22, 24 and 26 which are in a wye configuration. While coils 22 and 24 are connected in parallel in this particular embodiment to limit the range of motion of pointer 20, one skilled in the art will quickly recognize that other configurations can be easily substituted to provide the desired range of motion for other applications. Other types of air core gauges, such as a conventional cross coil type, may also be substituted in place of the wye type shown without departing from the spirit and scope of the claimed invention.

Figure 2:
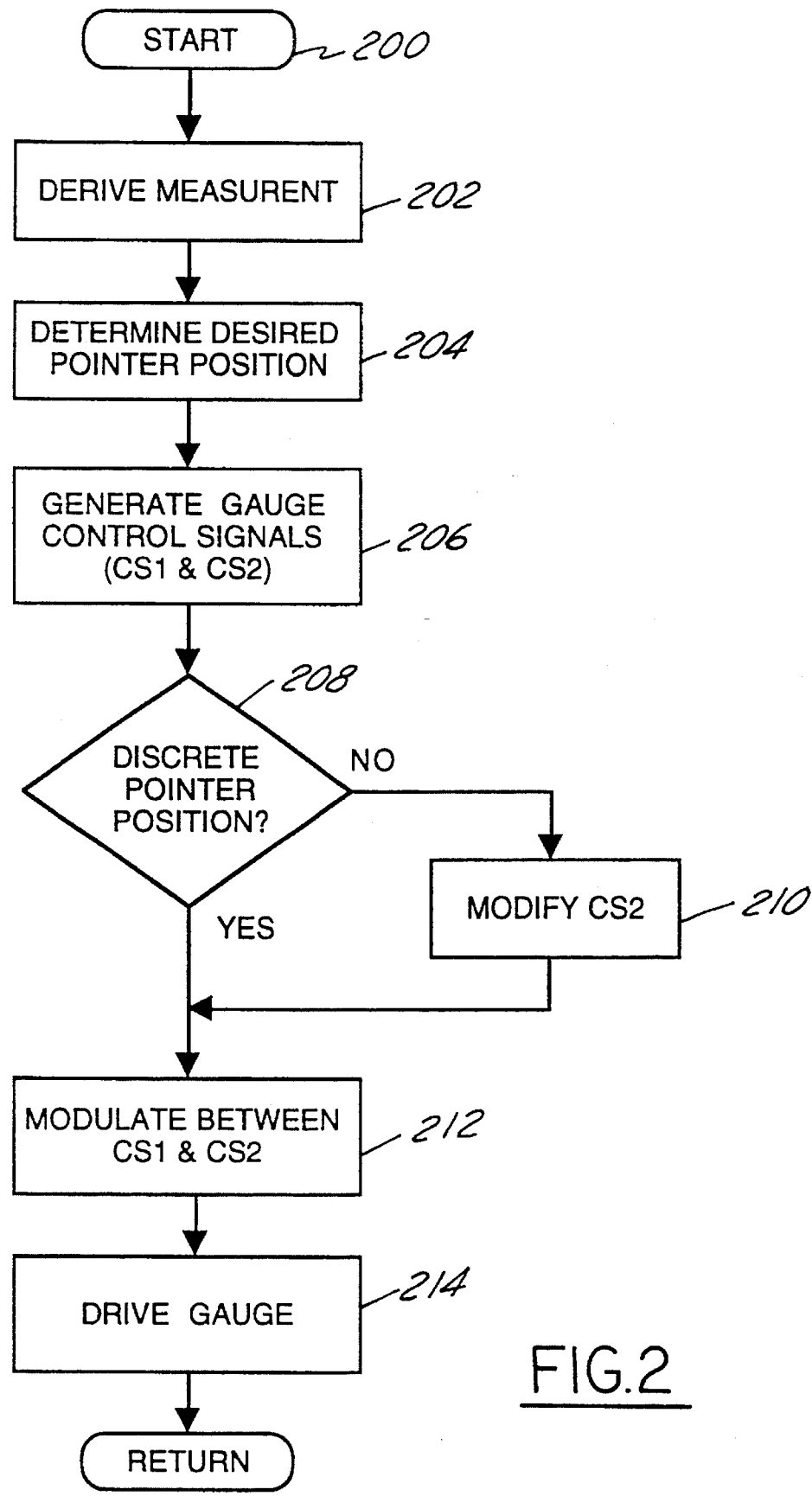
FIG. 2 is a flowchart illustrating various process steps performed by a portion of the embodiment shown in FIG. 1.

The operation of microcomputer 12 in driving pointer 20 of gauge 14 to a desired pointer position is now described with concurrent reference to FIGS. 1 and 2. At the start, the desired measurement to be indicated by pointer 20 on gauge 14 is derived (see steps 200 and 202). In fuel level measurement system 10, for example, the measurement is derived by first converting the resistance of fuel sensor 16 into a voltage. As shown, a voltage divider is created by resistor 28 which is connected at node 30 to a battery source (not shown), such as a vehicle battery, and connected to fuel sensor 16 at node 32. The voltage at node 32 is converted to a digital word through analog to digital (A/D) converter input 34 of microcomputer 12.

Preferably, microcomputer 12 is protected at A/D input 34 from current spikes and electromagnetic interference (EMI) by current limiting and EMI filtering, such as provided by resistor 36 and capacitor 38. As shown, a second A/D input 40 of microcomputer 12 is used to increase the accuracy of the fuel measurement by providing a reference to account for voltage fluctuations in the battery source. In this example, the reference is provided by a second voltage divider 42 which includes resistors 44 and 46. As is known in the art, the voltage at node 48 can be compared to the voltage at node 32 by microcomputer 12. Thus creating a ratioed A/D (or "RAD") fuel level filter valve. An advantage is thereby obtained of increasing the accuracy of the fuel level measurement to be derived.

During step 202, microcomputer 12 converts the digital word corresponding to the voltage at node 32 into a gallons equivalent of fuel remaining in vehicle fuel tank 17 using equation (1) when sensor 16 has a forward characteristic (i.e. resistance increases as fuel level increases) and equation (2) when sensor 16 has a reverse characteristic (i.e. resistance decreases as fuel level increases):

$$\text{Gallons}/100 = \frac{(FV*FG2) - FG3}{FG1 - FV} \quad (1)$$

$$\text{Gallons}/100 = \frac{FG3 - (FV*FG2)}{FG1 - FV} \quad (2)$$

wherein FV is the fuel level filter value of fuel sensor 16 derived from the RAD between nodes 34 and 48; FG1–3 are fuel gauge coefficients derived from the internal resistance characteristics of gauge 14, resolution (i.e. number of steps) of the drive period and the resistance characteristics of the gauge drive circuitry.

Continuing with FIG. 2, after the measurement to be displayed on gauge 14 is derived at step 202, microcomputer 12 determines the desired pointer position at step 204 responsive to the derived measurement. The desired pointer position in the system shown in FIG. 1 is calculated as a function of the fuel gauge coefficients and fuel level filter value according to the following equation:

$$\text{Desired Pointer Position} = \frac{2*FG1}{(FG2/FV) + FG3} \quad (3)$$

Theoretically, the range of motion of pointer 20 is divided into the maximum number of desired pointer positions possible given a desired pointer resolution across that range. The maximum number of desired pointer positions possible will depend upon hardware and software design constraints such as the minimum modulation frequency necessary to avoid observable pointer jitter (approximately 33 hz in the presently described embodiment) and the interrupt period required for microcomputer 12 to perform the necessary calculations.

Using the presently described embodiment as an example, assume the desired modulation frequency is 40 hz, the interrupt period or duty cycle resolution is 250 microseconds and the desired pointer resolution is 1%. Under these design constraints, the maximum number of desired pointer positions across the range of motion of pointer 20 is derived as follows:

$$\text{Modulation Period} = \frac{1}{\text{Modulation Frequency}} \quad (4)$$

$$\text{Maximum Desired Pointer Positions} = \frac{\text{Modulation Period}}{\text{Interrupt Period}} \quad (5)$$

Therefore, the maximum number of desired pointer positions in the present example is 100 positions or steps. The desired pointer position as calculated above in equation (3) corresponds to one of these 100 positions.

Continuing with FIG. 2, once the desired pointer position is determined at step 204, gauge control signals for driving gauge 14 are generated at step 206. In the presently described embodiment, microcomputer 12 generates ON/OFF times for both gauge control signals CS1 and CS2 which define respective duty cycles. Accordingly, control signals CS1 and CS2, although implemented in software in the present example as two sets of ON/OFF times, represent pulse width modulated signals with predetermined duty cycles. A 100% duty cycle or 100% ON time will drive pointer 20 towards the upper limit of its range of motion (i.e. "Full"). A 0% duty cycle or 100% OFF time will drive pointer 20 towards the lower limit of the range of motion (i.e. "Empty"). Alternatively, the signal may be inverted such that a 100% ON time will drive pointer 20 towards "Empty" and a 100% OFF time will drive pointer 20 towards "Full". Regardless, by varying the duty cycle or ON and OFF times of the gauge control signal, intermediate pointer positions are obtainable.

To determine the duty cycles for control signals CS1 and CS2, the range of motion of pointer 20 of gauge 14 is divided into a maximum number of discrete pointer positions. In the present embodiment, the number of discrete pointer positions across the range of motion is half the number of desired pointer positions. Accordingly, the resolution of the desired pointer position scale is twice that of the discrete pointer position scale. However, the duty cycle resolution of the drive period of control signals CS1 and CS2 equals the discrete pointer position resolution. Therefore, a control signal with a particular duty cycle will drive pointer 20 to a corresponding discrete pointer position which may or may not correspond to the desired pointer position.

In the embodiment shown in FIG. 2., control signals CS1 and CS2 are generated by microcomputer 12 with similar initial ON and OFF times determined by the following equations:

$$CS1_{OFF} = CS2_{OFF} = \text{INTEGER}\left(\frac{\text{Desired Pointer Position}}{2}\right) \quad (6)$$

$$CS1_{ON} = CS2_{ON} = MAXDC - CS1_{OFF} \quad (7)$$

wherein MAXDC is the maximum number of discrete pointer positions across the range of motion of the gauge.

A determination is next made at step 208 whether the desired pointer position corresponds to the discrete pointer position defined by the duty cycle ON/OFF times set in step 206. If so, no further manipulation of the control signals is required. Alternatively, if the desired pointer position falls between two discrete pointer positions such that it does not correspond with the discrete pointer position of the preset duty cycle, then control signal CS2 is modified at step 210 so its duty cycle corresponds to an adjacent discrete pointer position.

The determination at step 208 can be made in several ways. In one embodiment, for example, if the desired pointer position is an odd integer, then modification of control signal CS2 is necessary. If such a determination is made in step 208, then the modification in step 210 consists of incrementing the OFF time associated with control signal CS2 by one and decrementing the ON time of control signal CS2 also by one. Accordingly, the drive periods of control signal CS1 and CS2 remain consistent with each other.

Simultaneously generating control signals CS1 and CS2 in step 206 and subsequently modifying control signal CS2 in step 210 when required by step 208 is easily implemented in software. However, one skilled in the art will recognize that control signal CS2 could alternatively be generated to correspond to the discrete pointer position of control signal CS1 or an adjacent discrete pointer position immediately after step 208 so that the subsequent modification is not required.

Once control signals CS1 and CS2 are generated (steps 206 through 210), microcomputer 12 modulates drive output port 50 between control signal CS1 and control signal CS2 alternating drive periods to provide a modulated drive signal to gauge 14 (step 212). Stated another way, each drive period or cycle of the modulated drive signal alternates between control signals CS1 and CS2.

The modulated drive signal drives pointer 20 of gauge 14 to the desired pointer position (see steps 212 and 214). If the duty cycles of control signals CS1 and CS2 are equal, the pointer will be driven to the corresponding discrete pointer position. If, however, the duty cycle of control signal CS2 was modified or generated to correspond to a discrete pointer position other than that corresponding to control signal CS1, then pointer 20 will be driven to an average pointer position between the positions corresponding to control signals CS1 and CS2.

As a result of modulating output 50 between control signals CS1 and CS2, the drive signal to gauge 14 uses two sets of ON/OFF times during alternating drive periods. Pointer resolution is thereby doubled without requiring finer drive signal duty cycle resolution. One skilled in the art will appreciate that observable pointer jitter will not result so long as the modulating frequency is higher than the minimum frequency dictated by gauge damping characteristics such as pointer mass and inertia, rotor viscosity, etc.

Several key advantages are provided by modulating the drive signal as described above. One advantage is the ability to obtain the same pointer resolution while operating at a modulating frequency half of that which would be required to drive the same gauge with a drive signal having a continuous duty cycle. As a result, the interrupt time can be lengthened to allow more time for processing requirements without sacrificing pointer resolution. A second advantage is the ability to reduce current draw by the microprocessor because a microprocessor which runs at a lower oscillator frequency may be adequate to provide the desired pointer resolution. Finally, a substantial cost savings can be realized because a microprocessor with a pulse width modulated (PWM) output is not required for driving the gauge.

This concludes the description of the preferred embodiment. The reading of it by those skilled in the art will bring to mind many alterations and modifications without departing from the spirit and scope of the invention. For example, while the present embodiment has been described as steps performed by microcomputer 12, the present invention may also be used to advantage using any number of combinations of digital and analog devices commonly known in the art.

It is further important to note that the invention may similarly be used to advantage by generating and then modulating between more than two control signals or by modulating between the control signals according to a more complex predetermined repeating drive sequence or pattern. For example, if the modulation repeats a drive pattern of using control signal CS1 on/off times for two drive periods, and then control signal CS2 on/off times for one drive period, then pointer 20 would be driven to a pointer position one-third of the way between the discrete pointer positions corresponding to control signals CS1 and CS2. An advantage is thereby obtained of achieving even finer resolution between discrete pointer positions.

Similarly, while the invention has been described with reference to a system (shown in FIG. 1) configured to require only a single drive signal to gauge 14 at node 54, one skilled in the art will appreciate that the present invention may also be used to advantage for gauge configurations which utilize multiple PWM drive signals. Accordingly, it is intended that the scope of the invention be limited to only the following claims.

What is claimed:

1. A method for driving a gauge having a pointer, said method comprising the steps of:
    generating a first gauge control signal responsive to a gauge measurement signal, said first gauge control signal having a first duty cycle corresponding to a first pointer position;
    generating a second gauge control signal responsive to said signal, said second gauge control signal having a second duty cycle corresponding to a second pointer position; and
    modulating between said first gauge control signal and said second gauge control signal alternating drive periods to drive the pointer to display an average pointer position.

2. A method according to claim 1 wherein said first gauge control signal comprises first on and off times defining said first duty cycle and said second gauge control signal comprises second on and off times defining said second duty cycle.

3. A method according to claim 1 wherein the pointer has a known range of motion comprising a plurality of discrete pointer positions, said first and second pointer positions each correspond to one of said discrete pointer positions.

4. A method according to claim 3 further comprising the step of deriving a desired pointer position from said signal.

5. A method according to claim 3 wherein said first and second control signals are generated with identical on and off times, and said method further comprising the step of modifying said second gauge control signal when said desired pointer position is between two of said discrete pointer positions.

6. A method according to claim 5 wherein said second duty cycle comprises discrete on and off times, and said step of modifying said second gauge control signal comprises the steps of increasing said off time a predetermined amount and decreasing said on time said predetermined amount.

7. A method according to claim 1 wherein said step of modulating between said first and second control signals repeats a predetermined drive pattern.

8. A method according to claim 1 wherein said signal comprises a fuel level signal corresponding to fuel level in a vehicle fuel tank; said fuel level signal being generated by a sensor coupled to said vehicle fuel tank.

9. A method for driving a gauge having a pointer with a known range of motion to display a measurement, said method comprising:
    dividing the range of motion of the gauge into a plurality of discrete pointer positions;
    determining a desired pointer position corresponding to the measurement;
    generating first and second gauge control signals responsive to said desired pointer position, said first and second gauge control signals each having a duty cycle with first on and off times corresponding to a first discrete pointer position;

modifying said second gauge control signal to second on and off times corresponding to a second discrete pointer position when said desired pointer position is between said first discrete pointer position and said second discrete pointer position; and driving the gauge by modulating between said first gauge control signal and said second gauge control signal to alternate drive periods between said first gauge control signal and said second gauge control signal to drive the pointer to said desired pointer position.

10. A method according to claim 9 wherein the measurement is a measurement of fuel level in a vehicle fuel tank.

11. A method according to claim 9 wherein said step of modifying said second gauge control signal comprises the steps of increasing said second on time a predetermined amount and decreasing said second off time by said predetermined amount.

12. A fuel measurement system for displaying a measurement of fuel level in a vehicle fuel tank, said system comprising:

a fuel level sensor coupled to the vehicle fuel tank for deriving a fuel level signal;

processing means responsive to said fuel level signal for deriving a desired pointer position;

a control signal generator responsive to said processing means for generating a first fuel gauge control signal having a first duty cycle corresponding to a first pointer position and a second fuel gauge control signal having a second duty cycle corresponding to a second pointer position;

a modulator for modulating an output of said control signal generator between said first fuel gauge control signal and said second fuel gauge control signal to provide a modulated gauge control signal to drive the pointer to said desired pointer position; and a gauge having a pointer responsive to said modulated gauge control signal for displaying the measurement of fuel level.

13. A system according to claim 12 further comprising a signal converter for converting an output of said sensor into said fuel level signal.

14. A system according to claim 12 further comprising a signal conditioner for filtering said modulated output signal and wherein said gauge is responsive to said filtered modulated output signal.

15. A system according to claim 12 further comprising a current amplifier for amplifying said modulated output signal to drive said gauge.

16. A system according to claim 12 wherein said fuel level sensor comprises a float operated variable resistance fuel level sensor.

17. A system according to claim 12 wherein said pointer travels through a fixed range of motion comprising a plurality of discrete pointer positions, said first and second pointer positions each correspond to one of said discrete pointer positions, and said modulator modulates between said first and second gauge control signals when said desired pointer position is between said first and second pointer positions.

* * * * *